United States Patent
Frank et al.

(10) Patent No.: US 8,802,527 B1
(45) Date of Patent: Aug. 12, 2014

(54) GATE ELECTRODE OPTIMIZED FOR LOW VOLTAGE OPERATION

(71) Applicant: International Business Machines Corporation, Armonk, NY (US)

(72) Inventors: Martin M. Frank, Dobbs Ferry, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/841,984

(22) Filed: Mar. 15, 2013

(51) Int. Cl.
*H01L 21/336* (2006.01)
*H01L 31/113* (2006.01)

(52) U.S. Cl.
USPC ............................ 438/261; 438/287; 257/410

(58) Field of Classification Search
USPC ................. 438/261, 263, 264, 287, 624, 778; 257/324, 410–412
See application file for complete search history.

(56) References Cited

U.S. PATENT DOCUMENTS

| | | | |
|---|---|---|---|
| 7,226,831 B1 | 6/2007 | Metz et al. | |
| 7,303,996 B2 | 12/2007 | Wang et al. | |
| 8,367,496 B2 * | 2/2013 | Ando et al. | 438/216 |
| 2008/0142908 A1 | 6/2008 | Tseng et al. | |
| 2010/0052013 A1 | 3/2010 | Yoshinaga et al. | |

OTHER PUBLICATIONS

Duriez, B. et al., "Gate Stack Optimization for 65nm CMOS Low Power and High Performance Platform" IEEE International Electron Devices Meeting, 2004. IEDM Technical Digest (Dec. 13-15, 2004) pp. 847-850.

* cited by examiner

*Primary Examiner* — Hsien Ming Lee
(74) *Attorney, Agent, or Firm* — Scully, Scott, Murphy & Presser, P.C.; Louis J. Percello, Esq.

(57) ABSTRACT

A gate dielectric as formed includes a first interfacial dielectric layer and a high dielectric constant (high-k) dielectric layer containing a dielectric metal oxide. A polycrystalline semiconductor material layer is deposited on the high-k dielectric layer, and a second interfacial dielectric layer is formed at an interface between the polycrystalline semiconductor material layer and the high-k dielectric layer. A scavenging-metal-containing layer including a scavenging metal in an elemental form or in a metallic non-metal-element-containing compound is formed over the polycrystalline semiconductor material layer. A metallic compound such as a metallic nitride and a metallic carbide may be present above and/or over the scavenging-metal-containing layer. After formation of a gate stack by patterning, an anneal is performed, during which the oxygen in the interfacial dielectric layers diffuses into the scavenging-metal containing layer so that the thicknesses of the interfacial layers are reduced.

16 Claims, 9 Drawing Sheets

GATE ELECTRODE OPTIMIZED FOR LOW VOLTAGE OPERATION

BACKGROUND

The present disclosure generally relates to semiconductor structures, and particularly to a gate electrode including a material stack configured for scavenging oxygen and method of manufacturing the same.

Dielectric metal oxides having a dielectric constant greater than 7.9 (which is the dielectric constant of silicon nitride) are employed as a gate dielectric material for advanced field effect transistors. Interfacial oxide layers are collaterally formed at interfaces between a dielectric metal oxide material in a gate dielectric and other materials such as the semiconductor material of the channel and the conductive material of the gate electrode. The interfacial oxide layers reduce the effective dielectric constant of the gate dielectric, and therefore, the thickness of the interfacial oxide layers need to be minimized in order to provide high performance field effect transistors.

SUMMARY

A gate dielectric as formed includes a first interfacial dielectric layer contacting a channel region and a high dielectric constant (high-k) dielectric layer containing a dielectric metal oxide. A polycrystalline semiconductor material layer is deposited on the high-k dielectric layer, and a second interfacial dielectric layer is formed at an interface between the polycrystalline semiconductor material layer and the high-k dielectric layer. A scavenging-metal-containing layer including a scavenging metal in an elemental form or in a metallic non-metal-element-containing compound is formed over the polycrystalline semiconductor material layer. A metallic compound such as a metallic nitride and a metallic carbide may be present below, and/or over, the scavenging-metal-containing layer. After formation of a gate stack by patterning, an anneal is performed, during which the oxygen in the interfacial dielectric layers diffuses into the scavenging-metal containing layer so that the thicknesses of the interfacial layers are reduced.

According to an aspect of the present disclosure, a semiconductor structure is provided. The semiconductor structure includes a semiconductor substrate containing a semiconductor material, a gate dielectric, and a gate electrode. The gate dielectric includes a high dielectric constant (high-k) dielectric layer having a dielectric constant greater than 7.5 and is located over the semiconductor substrate. The gate electrode contacts the gate dielectric and contains a stack, from bottom to top, of a polycrystalline semiconductor material layer in contact with the gate dielectric, a metallic compound layer including a metallic compound selected from a metallic nitride and a metallic carbide, and a scavenging-metal-containing layer. The scavenging-metal-containing layer includes at least one scavenging metal. The at least one scavenging metal in the scavenging-metal containing layer is in an elemental form or in a metallic non-metal-element-containing compound including the at least one scavenging metal, at least one elemental metal selected from Ti and Ta, and at least one non-metal element. Each of the at least one scavenging metal is a metal (M) for which the Gibbs free energy change of the reaction, $Si + 2/y\ M_xO_y \rightarrow 2x/y\ M + SiO_2$, is positive. X and y are positive numbers. Gibbs free energy per oxygen atom for formation of an oxide for each of the at least one scavenging metal is equal to or more negative than Gibbs free energy per oxygen atom for formation of an oxide of any elemental metal within the metallic compound in the metallic compound layer.

According to another aspect of the present disclosure, a semiconductor structure includes a semiconductor substrate containing a semiconductor material, a gate dielectric, and a gate electrode. The gate dielectric includes a high dielectric constant (high-k) dielectric layer having a dielectric constant greater than 7.5 and is located over the semiconductor substrate. The gate electrode contacts the gate dielectric and contains a stack, from bottom to top, of a polycrystalline semiconductor material layer in contact with the gate dielectric, and a scavenging-metal-containing compound layer. The scavenging-metal-containing compound layer contacts the polycrystalline semiconductor material layer and includes at least one scavenging metal, at least one elemental metal selected from Ti and Ta, and at least one non-metal element. Each of the at least one scavenging metal is a metal (M) for which the Gibbs free energy change of the reaction, $Si + 2/y\ M_xO_y \rightarrow 2x/y\ M + SiO_2$, is positive. X and y are positive numbers. Gibbs free energy per oxygen atom for formation of an oxide for each of the at least one scavenging metal is equal to or more negative than Gibbs free energy per oxygen atom for formation of an oxide of any elemental metal that is present within the scavenging-material-containing nitride layer and is different from the at least one scavenging metal.

According to yet another method of the present disclosure, a method of forming a semiconductor structure is provided. A stack of layers is formed on a semiconductor substrate, which contains at least, from bottom to top, a first interfacial dielectric layer, a high dielectric constant dielectric layer including a dielectric metal oxide having a dielectric constant greater than 7.9, a second interfacial dielectric layer, a semiconductor material layer, a scavenging-metal-containing layer including at least one scavenging metal. The at least one scavenging metal in the scavenging-metal containing layer is in an elemental form or in a metallic non-metal-element-containing compound including the at least one scavenging metal, at least one elemental metal selected from Ti and Ta, and at least one non-metal element. Each of the at least one scavenging metal is a metal (M) for which the Gibbs free energy change of the reaction, $Si + 2/y\ M_xO_y \rightarrow 2x/y\ M + SiO_2$, is positive. X and y are positive numbers. The stack of layers is patterned to form a gate stack. The gate stack is annealed. At least one of the first interfacial dielectric layer and the second interfacial dielectric layer is thinned by outdiffusion of oxygen through the semiconductor material layer into the scavenging-metal-containing layer.

DETAILED DESCRIPTION

Figure 1:
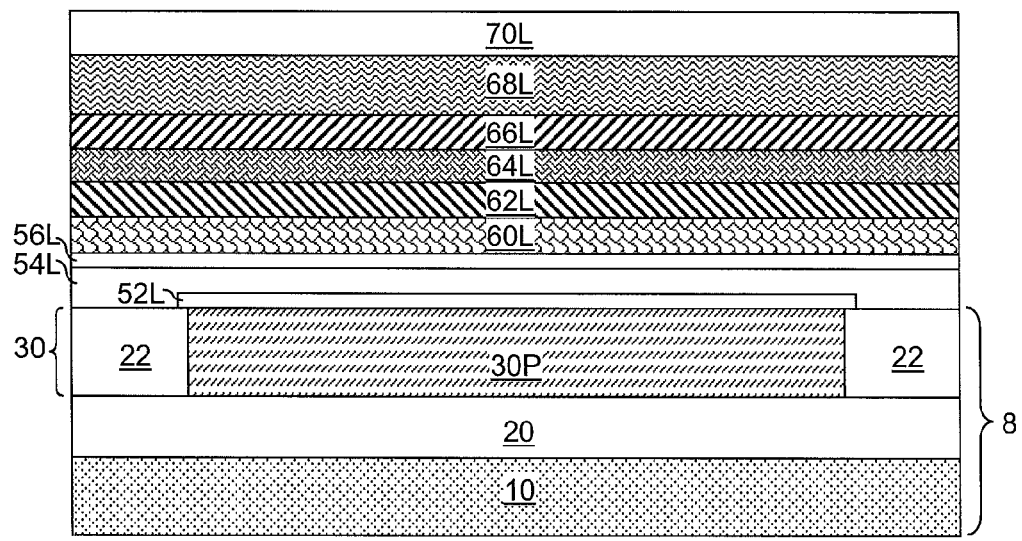
FIG. 1 is a vertical cross-sectional view of a first exemplary semiconductor structure after formation of gate stack layers including a first interfacial dielectric layer, a high dielectric constant (high-k) dielectric layer, a second interfacial dielectric layer, a semiconductor material layer, a first metallic compound layer, an oxygen-scavenging metal layer, a second metallic compound layer, an optional doped semiconductor material layer, and a gate cap dielectric layer according to a first embodiment of the present disclosure.

As stated above, the present disclosure relates to a gate electrode including a material stack configured for scavenging oxygen and method of manufacturing the same. Aspects of the present disclosure are now described in detail with accompanying figures. It is noted that like reference numerals refer to like elements across different embodiments. The drawings are not necessarily drawn to scale. The drawings are not necessarily drawn to scale. As used herein, ordinals are employed to distinguish similar elements, and a same element may be labeled with different ordinals across the specification and the claims.

Referring to FIG. 1, a first exemplary semiconductor structure according to a first embodiment of the present disclosure includes a semiconductor substrate 8 and a stack of material layers formed thereupon. The stack of material layers is herein referred to as gate stack layers. The semiconductor substrate 8 can be a semiconductor-on-insulator (SOI) substrate, a bulk semiconductor substrate, or a hybrid substrate including an SOI portion and a bulk portion. While the present disclosure is described employing an SOI substrate, embodiments employing a bulk semiconductor substrate or a hybrid substrate are expressly contemplated herein.

If the semiconductor substrate 8 is an SOI substrate, the semiconductor substrate 8 can include a handle substrate 10, a buried insulator layer 20, and a top semiconductor layer 30. The handle substrate 10 can be a semiconductor substrate, an insulator substrate, a conductive substrate, or a combination thereof. The handle substrate 10 provides mechanical support to the buried insulator layer 20, the top semiconductor layer 30, and the stack of material layers formed thereupon. The buried insulator layer 20 includes a dielectric material such as silicon oxide, silicon nitride, silicon oxynitride, or a combination thereof.

The top semiconductor layer 30 includes at least one semiconductor material portion 30P. Each of the at least one semiconductor material portion 30P may be a planar active region including a single crystalline semiconductor material and laterally surrounded by shallow trench isolation structures 22 including a dielectric material, or can be a semiconductor fin having physically exposed sidewalls. If the at least one semiconductor material portion 30P includes a semiconductor fin, shallow trench isolation structures may not be present, or top surfaces of the shallow trench isolation structures 22 may be recessed relative to the top surface of the at least one semiconductor material portion 30P.

The at least one semiconductor material portion 30P has a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In one embodiment, the semiconductor material of the at least one semiconductor material portion 30P includes silicon, a silicon-germanium alloy, or a silicon carbon alloy. In one embodiment, the semiconductor material of the at least one semiconductor material portion 30P is single crystalline silicon, a single crystalline silicon-germanium alloy, or a single crystalline silicon-carbon alloy.

The semiconductor material of the at least one semiconductor material portion 30P may be appropriately doped either with p-type dopant atoms or with n-type dopant atoms. The dopant concentration of the at least one semiconductor material portion 30P, and may be from $1.0 \times 10^{15}/cm^3$ to $1.0 \times 10^{19}/cm^3$, and typically from $1.0 \times 10^{16}/cm^3$ to $3.0 \times 10^{18}/cm^3$, although lesser and greater dopant concentrations are contemplated herein also. In one embodiment, the at least one semiconductor material portion 30P is single crystalline.

An unpatterned first interfacial dielectric layer 52L may be formed on the exposed semiconductor surface of the at least one semiconductor material portion 30P. As used herein, an "unpatterned" layer refers to a layer that is formed as a blanket material layer and is not patterned by lithographic methods or by an etch. In one embodiment, the unpatterned first interfacial dielectric layer 52L may be formed by treatment of exposed semiconductor surfaces with a chemical. For example, the process step for this wet chemical oxidation may include treating a cleaned semiconductor surface (such as a semiconductor surface treated with hydrofluoric acid) with a mixture of ammonium hydroxide, hydrogen peroxide and water (in a 1:1:5 ratio) at 65° C. Alternately, the unpatterned first interfacial dielectric layer 52L can also be formed by treating the HF-last semiconductor surface in ozonated aqueous solutions, with the ozone concentration usually varying from, but not limited to: 2 parts per million (ppm) to 40 ppm.

The unpatterned first interfacial dielectric layer 52L helps minimize mobility degradation in the at least one semiconductor material portion 30P due to high-k dielectric material in the unpatterned high-k dielectric layer 54L. However, the thickness of the unpatterned first interfacial dielectric layer 52L is thicker than necessary and increases the effective oxide thickness (EOT) of a composite dielectric stack, which includes the unpatterned first interfacial dielectric layer 52L and the unpatterned high-k dielectric layer 54L. The scalability of EOT is severely limited by the thickness of the unpatterned first interfacial dielectric layer 52L. In case the at least one semiconductor material portion 30P is a silicon portion, the unpatterned first interfacial dielectric layer 52L can be a silicon oxide layer.

The thickness of the unpatterned first interfacial dielectric layer 52L can be in a range from 0.3 nm to 1.5 nm, although lesser and greater thicknesses are also contemplated herein. Alternatively, the unpatterned first interfacial dielectric layer 52L may be formed by formation of a native oxide on physically exposed surfaces of the at least one semiconductor material portion 30P, or may be formed by thermal oxidation, plasma oxidation, thermal nitridation, plasma nitridation, thermally oxynitridation, plasma oxynitridation, and/or deposition of a silicon oxide material, silicon nitride material, silicon oxynitride material, or a combination thereof, An unpatterned high dielectric constant (high-k) dielectric layer 54L is formed directly on the top surface of the unpatterned first interfacial dielectric layer 52L. Even in the case the unpatterned first interfacial dielectric layer 52L is not formed, the deposition of the unpatterned high-k dielectric layer 54L and subsequent thermal processes lead to the formation of pre-existing interfacial layer between the at least one semiconductor material portion 30P and the unpatterned high-k dielectric layer 54L.

The unpatterned high-k dielectric layer 54L comprises a high dielectric constant (high-k) material comprising a dielectric metal oxide and having a dielectric constant that is greater than the dielectric constant of silicon nitride of 7.5. The unpatterned high-k dielectric layer 54L may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc.

The dielectric metal oxide includes a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In one embodiment, the thickness of the unpatterned high-k dielectric layer 54L may be from 1 nm to 5 nm. In one embodiment, the thickness of the unpatterned high-k dielectric layer 54L may be from 1.2 nm to 2.5 nm.

A semiconductor material is deposited on the top surface of the unpatterned high-k dielectric layer 54L to form an unpatterned semiconductor material layer 60L, which is a blanket semiconductor material layer that is not patterned. In one embodiment, the semiconductor material of the unpatterned semiconductor material layer 60L can be a compound semiconductor material such as gallium arsenide, indium arsenide, indium phosphide, other III-V compound semiconductor materials, II-VI compound semiconductor materials, or combinations thereof. Exemplary III-V compound semiconductor materials that can be employed for the unpatterned semiconductor material layer 60L include InSb, InP, InN, InGaSb, InGaP, InGaN, InGaAsSb, InGaAsP, InGaAsN, InGaAs, InAsSbP, InAsSb, InAs, InAlAsN, GaSb, GaP, GaN, GaInNAsSb, GaInAsSbP, GaAsSbN, GaAsSb, GaAsP, GaAsN, GaAs, BP, BN, BN, BAs, AlSb, AlP, AlN, AlInSb, AllAsP, AlInAs, AlGaP, AlGaN, AlGaInP, AlGaAsP, AlGaAsN, AlGaAs, and AlAs. In another embodiment, the semiconductor material of the unpatterned semiconductor material layer 60L can include an elemental semiconductor material such as silicon, germanium, an alloy of at least one of silicon, germanium, and carbon. Exemplary elemental semiconductor materials that can be employed for the unpatterned semiconductor material layer 60L include silicon, germanium, a silicon-germanium alloy, a silicon-carbon alloy, and a silicon-germanium-carbon alloy.

The semiconductor material of the unpatterned semiconductor material layer 60L can be doped by p-type dopants or n-type dopants. The dopant concentration in the unpatterned semiconductor material layer 60L can be in a range from $3.0 \times 10^{19}/cm^3$ to $3.0 \times 10^{20}/cm^3$, although lesser and greater dopant concentrations are contemplated herein also. The thickness of the unpatterned semiconductor material layer 60L can be, for example, from 1.5 nm to 8 nm, although lesser and greater thicknesses can also be employed. In one embodiment, the thickness of the unpatterned semiconductor material layer 60L can be in a range from 3 nm to 5 nm. The unpatterned semiconductor material layer 60L can be amorphous or polycrystalline as deposited. The unpatterned semiconductor material layer 60L can be deposited, for example, by chemical vapor deposition (CVD) or atomic layer deposition (ALD).

A surface portion of the semiconductor material of the unpatterned semiconductor material layer 60L in contact with the unpatterned high-k dielectric layer 54L becomes oxidized during deposition of the unpatterned semiconductor material layer 60L, or after physical exposure of the surface of the unpatterned semiconductor material layer 60L to an oxygen-including ambient such as air. The oxygen atoms in the unpatterned high-k dielectric layer 54L combines with the semiconductor atoms of the unpatterned semiconductor material layer 60L. The oxide material derived from the semiconductor material of the unpatterned semiconductor material layer 60L and the oxygen atoms of the unpatterned high-k dielectric layer 54L constitute an unpatterned second interfacial dielectric layer 56L. The thickness of the unpatterned second interfacial dielectric layer 56L can be in a range from 0.1 nm to 1.0 nm, although lesser and greater thicknesses can also be employed.

It is noted that oxidation of a surface portion of a semiconductor material in contact with a high-k dielectric material occurs naturally to form an oxide of the semiconductor material, which has a lower dielectric constant than the dielectric constant of the high-k dielectric material. Thus, formation of the oxide of the semiconductor material has the deleterious effect of reducing the effective dielectric constant of a gate dielectric. For this reason, deposition of a semiconductor material directly on a surface of a high-k dielectric material employed as a gate dielectric is avoided in the art.

According to an embodiment of the present disclosure, the unpatterned semiconductor material layer 60L is deposited directly on the surface of the unpatterned high-k dielectric layer 54L. The deleterious effect of lowering the effective dielectric constant of a gate dielectric is mitigated by formation of a scavenging-metal-containing layer, and a subsequent anneal that induce outdiffusion of oxygen from the oxide of the semiconductor material into the scavenging-metal-containing layer. The presence of the semiconductor material from the unpatterned semiconductor material layer 60L with the gate electrode, however, provides the benefit of depletion effect and reduction of the applied electrical field during a high voltage operation of field effect transistors (such as during a burn-in operation).

At least one metallic material layer including a scavenging-metal-containing layer 64L is formed on the unpatterned semiconductor material layer 60L. In one embodiment, the at least one metallic material layer including the scavenging-metal-containing layer 66 can be a stack, from bottom to top, of an unpatterned first metallic compound layer 62L, the scavenging-metal-containing layer 64L, and an unpatterned second metallic compound layer 66L.

The unpatterned first metallic compound layer 62L can be deposited directly on the top surface of the unpatterned high-k dielectric layer 54L. The unpatterned first metallic compound layer 62L may be formed, for example, by chemical vapor deposition (CVD), physical vapor deposition (PVD), or atomic layer deposition (ALD).

The material of the unpatterned first metallic compound layer 62L is herein referred to as a "first metallic compound" which may be a conductive transition metal nitride or a conductive transition metal carbide. The first metallic compound is a compound of a first metallic element selected from transition metals and at least one non-metal element. As used herein, a "non-metal element" refers to any element that is not a metal or a metalloid. A complete list of non-metal elements includes: He, C, N, O, F, Ne, P, S, Cl, Ar, Se, Br, Kr, I, Xe, At, and Rn, In one embodiment, the non-metal element can include nitrogen and/or carbon. In one embodiment, the non-metal element can be selected from a group consisting of nitrogen and carbon. If the non-metal element is nitrogen, the first metallic compound is a transition metal nitride. If the non-metal element is carbon, the first metallic compound is a transition metal carbide. For example, the first metallic compound may be selected from TiN, TiC, TaN, TaC, and a combination thereof. As used herein, transition metals include elements from Group 3B, 4B, 5B, 6B, 7B, 8B, 1B, and 2B and Lanthanides and Actinides in the Periodic Table of the Elements. The thickness of the unpatterned first metallic compound layer 62L may be from 1 nm to 10 nm, and preferably from 3 nm to 10 nm, although lesser and greater thicknesses are also contemplated herein.

An unpatterned scavenging-metal-containing layer 64L is deposited directly on the top surface of the unpatterned first metallic compound layer 62L. The unpatterned scavenging-metal-containing layer 64L may be formed, for example, by chemical vapor deposition (CVD), physical vapor deposition (PVD), or atomic layer deposition (ALD). In one embodiment, the first exemplary semiconductor structure is transferred from a processing chamber that deposits the unpatterned first metallic compound layer 62L to another processing chamber that deposits the unpatterned scavenging-metal-containing layer 64L without breaking vacuum to prevent formation of any interfacial layer by oxidation or introduction of oxygen into the unpatterned first metallic compound layer 62L.

The material of the unpatterned scavenging-metal-containing layer 64L "scavenges" impurity oxygen from neighboring metallic layers during subsequent processing. For the unpatterned scavenging-metal-containing layer 64L to effectively scavenge impurity oxygen in subsequent processing steps, it is necessary that introduction of oxygen into the unpatterned scavenging-metal-containing layer 64L is suppressed during the formation step. Further, it is necessary to select the material for the unpatterned scavenging-metal-containing layer 64L so that the material of the unpatterned scavenging-metal-containing layer 64L effectively scavenges impurity oxygen atoms that originate from the materials of the unpatterned first interfacial dielectric layer 52L, the unpatterned high-k dielectric layer 54L, and/or the unpatterned second interfacial dielectric layer 56L, and pass through the materials of the unpatterned semiconductor material layer 60L and the unpatterned first metallic compound layer 62L. In one embodiment, the thickness of the unpatterned scavenging-metal-containing layer 64L may be from 0.1 nm to 3.0 nm, although lesser and greater thicknesses are also contemplated herein.

In one embodiment, the unpatterned scavenging-metal-containing layer 64L may include at least one scavenging metal in elemental form. In other words, the at least one scavenging metal is present in an elemental form within the scavenging-metal-containing layer. As used herein, a scavenging metal is a metal (M) for which the Gibbs free energy change of the reaction, $Si+2/y\ M_xO_y \rightarrow 2x/y\ M+SiO_2$, is positive. X and y are positive numbers. X and y may both be 1, or one of x and y may be 1 and the other of x and y may be a positive integer greater than 1, or x and y may be integers greater than 1. Alternately, one or more of x and y may be a positive real number that is not an integer. In one embodiment, x may be a positive integer less than 100, and y may be a real number greater than 0 and less than 100. Typical elemental metals that may be selected for the unpatterned scavenging-metal-containing layer 64L in this case include, but are not limited to, Al, Be, Mg, Ca, Sr, Ba, Sc, Y, La, Ti, Zr, Hf, Dy, Lu, Er, Pr, and Ce. In on embodiment, the at least one scavenging metal is aluminum in elemental form. In one embodiment, the unpatterned scavenging-metal-containing layer 64L consists of at least one alkaline earth metal. In another embodiment, the unpatterned scavenging-metal-containing layer 64L consists of at least one transition metal. In yet another embodiment, the unpatterned scavenging-metal-containing layer 64L consists of a mixture of at least one alkaline earth metal and at least one transition metal.

In one embodiment, the unpatterned scavenging-metal-containing layer 64L may include at least one scavenging metal that is present in a metallic non-metal-element-containing compound. As used herein, a "non-metal-element-containing compound" is any compound that includes at least one non-metal at an atomic concentration greater than 1%. As used herein, a "metallic non-metal-element-containing compound" is any compound including at least one metallic element at an atomic concentration greater than 1% and including at least one non-metal element at an atomic concentration greater than 1% and is conductive. In one embodiment, the metallic non-metal-element-containing compound consists essentially of the at least one scavenging metal, at least one elemental metal selected from Ti and Ta, and at least one non-metal element. Typical elemental metals that may be selected for the unpatterned scavenging-metal-containing layer 64L in this case include, but are not limited to, Al, Be, Mg, Ca, Sr, Ba, Sc, Y, La, Ti, Zr, Hf, Dy, Lu, Er, Pr, and Ce. In one embodiment, the at least one scavenging metal can be aluminum that is present within TiAlN, TaAlN, TiHfN, TaHfN, TiLaN, TaLaN, or an alloy thereof. In one embodiment, the at least one non-metal element can be nitrogen. In a non-limiting example, the unpatterned scavenging-metal-containing layer 64L can consist essentially of TiAlN, TaAlN, or an alloy thereof. In one embodiment, the at least one non-metal element can be carbon. In a non-limiting example, and the unpatterned scavenging-metal-containing layer 64L can consist essentially of TiAlC, TaAlC, TiHfC, TaHfC, TiLaC, TaLaC, or an alloy thereof. In one embodiment, the at least one non-metal element can be nitrogen and carbon. In a non-limiting example, the unpatterned scavenging-metal-containing layer 64L can consist essentially of TiAlNC, TaAlNC, TiHfNC, TaHfNC, TiLaNC, TaLaNC, or an alloy thereof.

An unpatterned second metallic compound layer 66L can be deposited directly on the top surface of the unpatterned scavenging-metal-containing layer 64L. The unpatterned second metallic compound layer 66L may be formed, for example, by chemical vapor deposition (CVD), physical vapor deposition (PVD), or atomic layer deposition (ALD). Preferably, the first exemplary semiconductor structure is transferred from the processing chamber that deposits the unpatterned scavenging-metal-containing layer 64L to a processing chamber that deposits the unpatterned second metallic compound layer 66L without breaking vacuum to prevent formation of any interfacial layer by oxidation or introduction of oxygen into the unpatterned scavenging-metal-containing layer 64L.

The material of the unpatterned second metallic compound layer 66L is herein referred to as a "second metallic compound" which may be a conductive transition metal nitride or a conductive transition metal carbide. The second metallic compound is a compound of a second metallic element selected from transition metals and a non-metal element. If the non-metal element is nitrogen, the second metallic compound is a transition metal nitride. If the non-metal element is carbon, the second metallic compound is a transition metal carbide. For example, the second metallic compound may be selected from TiN, TiC, TaN, TaC, and a combination thereof. The thickness of the unpatterned second metallic compound layer 66L may be from lower from 1 nm to 100 nm, and preferably from 3 nm to 10 nm, although lesser and greater thicknesses are also contemplated herein.

In one case, the first metallic compound and the second metallic compound are the same material. In another case, the first metal compound and the second metal compound are different materials.

In one embodiment, the material for the unpatterned scavenging-metal-containing layer 64L is selected such that Gibbs free energy per oxygen atom for formation of an oxide for the unpatterned scavenging-metal-containing layer 64L is equal to or more negative than Gibbs free energy per oxygen atom for formation of an oxide of the first elemental metal within the first metallic compound for the unpatterned first metallic compound layer 62L. Further, the material for the unpatterned scavenging-metal-containing layer 64L is selected such that Gibbs free energy per oxygen atom for formation of an oxide for the unpatterned scavenging-metal-containing layer 64L is equal to or more negative than Gibbs free energy per oxygen atom for formation of an oxide of the second elemental metal within the second metallic compound for the unpatterned second metallic compound layer 66L.

For example, the first and second metallic compounds may be selected from TiN, TiC, TaN, TaC, and a combination thereof. The unpatterned scavenging-metal-containing layer 64L includes at least one of Al, Be, Mg, Ca, Sr, Ba, Sc, Y, La, Ti, Zr, Hf, Dy, Lu, Er, Pr, and Ce.

In another embodiment, the material for the unpatterned scavenging-metal-containing layer 64L is selected such that Gibbs free energy per oxygen atom for formation of an oxide for the unpatterned scavenging-metal-containing layer 64L is more negative than Gibbs free energy per oxygen atom for formation of an oxide of the first elemental metal within the first metallic compound for the unpatterned first metallic compound layer 62L. Further, the material for the unpatterned scavenging-metal-containing layer 64L is selected such that Gibbs free energy per oxygen atom for formation of an oxide for the unpatterned scavenging-metal-containing layer 64L is more negative than Gibbs free energy per oxygen atom for formation of an oxide of the second elemental metal within the second metallic compound for the unpatterned second metallic compound layer 66L.

In one illustrative example according to this embodiment, each of the first metallic compound and the second metallic compound may be selected from TaN, TaC, and a combination thereof. Because titanium (Ti) has a more negative Gibbs free energy per oxygen atom for formation of an oxide than tantalum (Ta), the unpatterned scavenging-metal-containing layer 64L may comprise a metal in an elemental form and selected from Al, Be, Mg, Ca, Sr, Ba, Sc, Y, La, Ti, Zr, Hf, Dy, Lu, Er, Pr, and Ce in this illustrative example.

In another illustrative example according to this embodiment, at least one of the first metallic compound and the second metallic compound may be selected from TiN, TiC, and a combination thereof. The unpatterned scavenging-metal-containing layer 64L may include a metal in an elemental form and selected from Al, Be, Mg, Ca, Sr, Ba, Sc, Y, La, Zr, Hf, Dy, Lu, Er, Pr, and Ce in this illustrative example.

In an illustrative example, the first metallic compound of the unpatterned first metallic compound layer 62L and the second metallic compound of the unpatterned second metallic compound layer 66L are TiN, and the unpatterned scavenging-metal-containing layer 64L is an aluminum layer including aluminum in elemental metal form or one of an TiAlN layer, TaAlN layer, and a TiTaAlN layer.

In one embodiment, an unpatterned doped semiconductor material layer 68L is deposited directly on the top surface of the unpatterned second metallic compound layer 66L, for example, by low pressure chemical vapor deposition (LPCVD), rapid thermal chemical vapor deposition (RTCVD), or plasma enhanced chemical vapor deposition (PECVD). The unpatterned doped semiconductor material layer 68L can be doped with p-type dopants or n-type dopants. The unpatterned doped semiconductor material layer 68L may comprise doped polysilicon, a doped polycrystalline silicon germanium alloy, a doped polycrystalline silicon carbon alloy, or a doped polycrystalline silicon germanium carbon alloy. The unpatterned doped semiconductor material layer 68L may be formed as a doped polycrystalline semiconductor layer through in-situ doping. Alternately, the unpatterned doped semiconductor material layer 68L may be doped by ion implantation of dopant atoms after deposition of the unpatterned doped semiconductor material layer 68L and prior to patterning of a gate electrode. Yet alternately, implantation of dopant ions may be performed on a remaining portion of the unpatterned doped semiconductor material layer 68L after patterning of the gate electrode in a subsequent processing step. The thickness of the unpatterned doped semiconductor material layer 68L may be from 10 nm to 300 nm, and typically from 50 nm to 100 nm, although lesser and greater thicknesses are also contemplated herein. Embodiments are expressly contemplated in which the unpatterned doped semiconductor material layer 68L is not formed.

An unpatterned gate cap dielectric layer 70L can be formed on the top surface of the unpatterned doped semiconductor material layer 68L. The unpatterned gate cap dielectric layer 70L includes a dielectric material such as silicon oxide or a dielectric metal oxide. The unpatterned gate cap dielectric layer 70L can be deposited, for example, by chemical vapor deposition (CVD). The thickness of the unpatterned gate cap dielectric layer 70L can be in a range from 3 nm to 60 nm, although lesser and greater thicknesses can also be employed.

Figure 2:
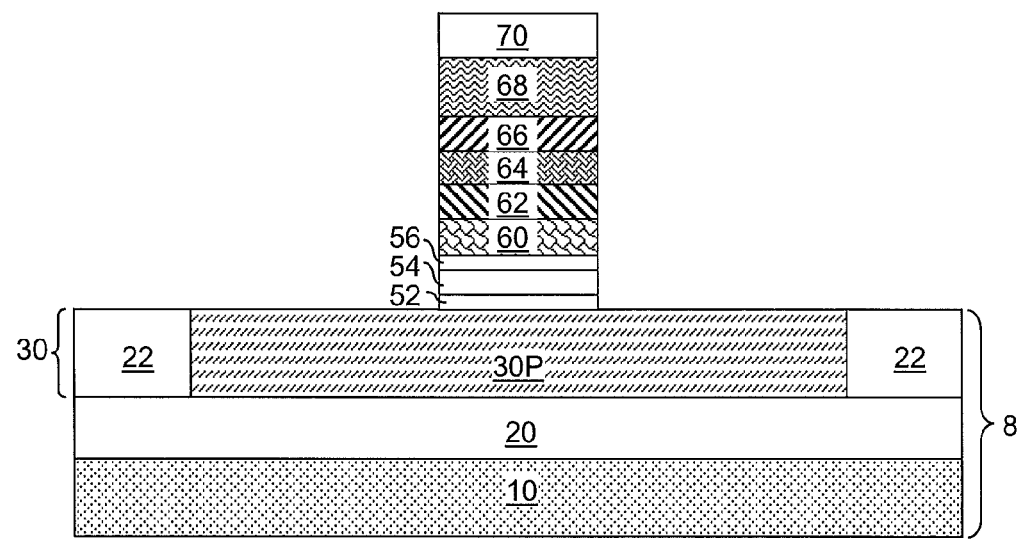
FIG. 2 is a vertical cross-sectional view of the first exemplary semiconductor structure after formation of a gate stack structure by patterning the gate stack layers according to the first embodiment of the present disclosure.
Figure 3:
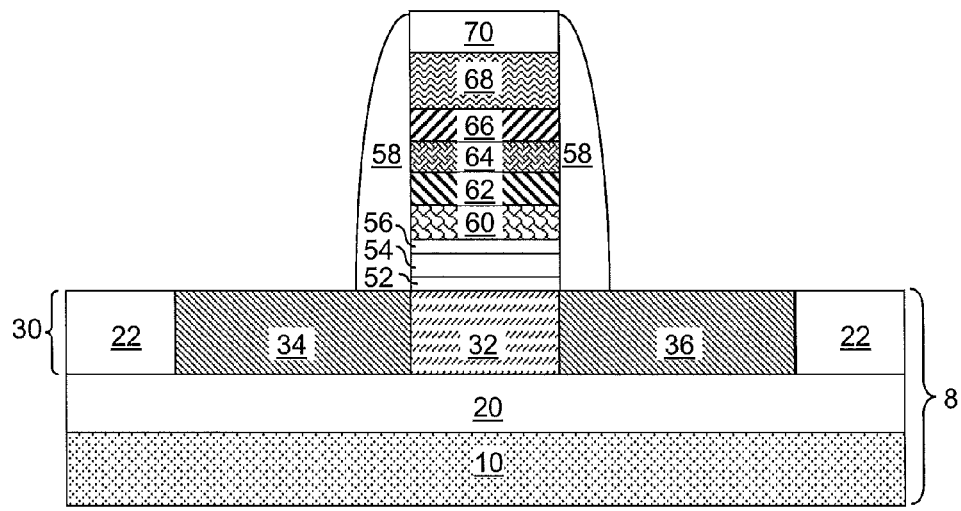
FIG. 3 is a vertical cross-sectional view of the first exemplary semiconductor structure after formation of a gate spacer and source and drain regions according to the first embodiment of the present disclosure.

Referring to FIG. 2, a photoresist layer (not shown) is applied to the top surface of the unpatterned gate cap dielectric layer 70L and lithographically patterned to form a photoresist portion, which has the shape of a gate electrode to be subsequently formed. The pattern in the photoresist portion is transferred into the stack of the unpatterned gate cap dielectric layer 70L, unpatterned doped semiconductor material layer 68L, the unpatterned second metallic compound layer 66L, the unpatterned scavenging-metal-containing layer 64L, the unpatterned first metallic compound layer 62L, the unpatterned second interfacial dielectric layer 56L, the unpatterned high-k dielectric layer 54L, and the unpatterned first interfacial dielectric layer 52L. The pattern transfer may be effected by an anisotropic etch that employs the photoresist portion as an etch mask. Optionally, at least one isotropic etch may be employed for the pattern transfer into the unpatterned second interfacial dielectric layer 56L, the unpatterned high-k dielectric layer 54L, and/or the unpatterned first interfacial dielectric layer 52L.

A remaining portion of the unpatented gate cap dielectric layer 70L after the pattern transfer constitutes a gate cap dielectric portion 70. Remaining portions of the unpatterned doped semiconductor material layer 68L, the unpatterned second metallic compound layer 66L, the unpatterned scavenging-metal-containing layer 64L, the unpatterned first metallic compound layer 62L, and the unpatterned semiconductor material layer 60L after the pattern transfer constitute a gate electrode, which include a doped semiconductor material portion 68, an second metallic compound layer 66, a scavenging-metal-containing layer 64, a first metallic compound layer 62, and a semiconductor material layer 60. The gate electrode (60, 62, 64, 66, 68) is typically patterned as a line having a width, which is referred to as a "gate length." The gate length depends on the device characteristics and may be from the lithographically printable smallest dimension to 10 microns. Typically, the gate length is from 32 nm to 1 micron, although lesser and greater gate lengths are also contemplated herein.

Remaining portions of the unpatterned second interfacial dielectric layer 56L, the unpatterned high-k dielectric layer 54L, and the unpatterned first interfacial dielectric layer 52L after the pattern transfer constitutes a gate dielectric. The remaining portion of the unpatterned second interfacial dielectric layer 56L after the pattern transfer is herein referred to as a second interfacial dielectric layer 56. The remaining portion of the unpatterned high-k dielectric layer 54L after the pattern transfer is herein referred to as a high-k dielectric layer 54, and the remaining portion of the unpatterned first interfacial dielectric layer 52L after the pattern transfer is herein referred to as a first interfacial dielectric layer 52. In one embodiment, the gate dielectric (52, 54, 56) can have an effective oxide thickness (EOT) in a range from 1 nm to 10 nm. The photoresist portion is subsequently removed, for example, by ashing.

The sidewalls of the gate cap dielectric portion 70, the gate electrode (60, 62, 64, 66, 68) and the gate dielectric (52, 54, 56) can be typically substantially vertical, i.e., parallel to the surface normal of the exposed surface of the at least one semiconductor material portion 30P. Further, the sidewalls of the gate cap dielectric portion 70, the gate electrode (60, 62, 64, 66, 68) and the gate dielectric (52, 54, 56) can be typically substantially vertically coincident with each other. As used herein, a first surface is substantially vertically coincident with a second surface if there exists a vertical surface from the first surface and the second surface do not deviate by more than the sum of the surface roughness of the first surface and the surface roughness of the second surface. The gate cap dielectric portion 70, the gate electrode (60, 62, 64, 66, 68), and the gate dielectric (52, 54, 56) are collectively referred to as a gate stack (52, 54, 56, 60, 62, 64, 66, 68, 70).

Optionally, source and drain extension regions (not shown) may be formed by ion implantation that employs the gate stack (52, 54, 56, 60, 62, 64, 66, 68, 70) as an implantation mask. The source and drain extension regions can have a doping of the opposite conductivity type of the doping of the at least one semiconductor material portion 30P. For example, if the at least one semiconductor material portion 30P has a p-type doping, the source and drain extension regions have an n-type doping, and vice versa.

Optionally, a halo implantation may be performed at this step to introduce dopants of the same conductivity type as the doping of the at least one semiconductor material portion 30P to volumes of the at least one semiconductor material portion 30P located underneath peripheral portions of the gate stack (52, 54, 56, 60, 62, 64, 66, 68, 70).

A gate spacer 58 laterally abutting the sidewalls of the gate stack (52, 54, 56, 60, 62, 64, 66, 68, 70) is formed, for example, by deposition of a conformal dielectric material layer followed by an anisotropic ion etching. Vertical portions of the conformal dielectric material layer that remains on the sidewalls of the gate stack (52, 54, 56, 60, 62, 64, 66, 68, 70) after the anisotropic etch constitute a gate spacer 58, which laterally surrounds the gate stack (52, 54, 56, 60, 62, 64, 66, 68, 70). In one embodiment, the gate spacer 58 includes an oxygen-impermeable material such as silicon nitride.

A source region 34 and a drain region 36 are formed by ion implantation that employs the gate stack (52, 54, 56, 60, 62, 64, 66, 68, 70) and the gate spacer 58 as an implantation mask. The source region 34 and the drain region 36 can have a doping of the same conductivity type as the doping of the source and drain extension regions (if such source and drain extension regions are present). The dopant concentration of the source region 34 and the drain regions 36 may be from $1.0 \times 10^{19}/cm^3$ to $1.0 \times 10^{21}/cm^3$, although lesser and greater dopant concentrations are contemplated herein also. A remaining portion of the at least one semiconductor portion 30P between the source region 34 and the drain region 36 constitutes a body region 32.

An activation anneal is thereafter performed to activate electrical dopants implanted within the source and drain extension regions, the source region 34, and the drain region 36. The temperature of the activation anneal may be in a range from 800° C. to 1,050° C., although lesser and greater temperatures may also be employed. Such an activation anneal is typically performed in an oxidizing ambient during which the compositional integrity of the high-k dielectric layer may be compromised in prior art semiconductor structures. In the present disclosure, however, the thickening of the first interfacial dielectric layer 52 and the second interfacial dielectric layer 54 are prevented because the scavenging-metal-containing layer 64 consumes oxygen atoms that diffuse downward from the doped semiconductor material portion 68. If the material of the semiconductor material layer 60 is amorphous prior to the activation anneal, the material of the semiconductor material layer 60 becomes polycrystalline. As such, the semiconductor material layer 60 is a polycrystalline semiconductor material layer.

Further, oxygen atoms that diffuse upward from the first interfacial dielectric layer 52, the high-k dielectric layer 54, or the second interfacial dielectric layer 56, and through the semiconductor material layer 60 and the first metallic compound layer 62, are captured in the scavenging-metal-containing layer 64 by reacting the scavenging metal in the scavenging-metal-containing layer 64. This mechanism reduces the thickness of the first interfacial dielectric layer 52 and the thickness of the second interfacial dielectric layer 56. For example, if the thickness of the unpatterned first interfacial dielectric layer 52L is in a range from 0.3 nm to 1.5 nm, the thickness of the first interfacial dielectric layer 52 after the activation anneal may be in a range from 0 nm to 0.7 nm. If the thickness of the unpatterned first interfacial dielectric layer 56L is in a range from 0.1 nm to 1.0 nm, the thickness of the first interfacial dielectric layer 56 after the activation anneal may be in a range from 0 nm to 0.5 nm.

The reduction in the thicknesses of the first and second interfacial dielectric layers (52, 56) by the activation anneal increases the effective dielectric constant of the gate dielectric (52, 54, 56) to a value that is closer to the dielectric constant of the high-k dielectric layer 54 than prior to the activation anneal. The increase in the effective dielectric constant of the gate dielectric (52, 54, 56) can be advantageously employed to enhance the performance of the field effect transistor.

Further, the presence of the semiconductor material layer 60 introduces depletion effect in the gate electrode (60, 62, 64, 66, 68) during the operation of the field effect transistor. The depletion effect causes a voltage drop across the semiconductor material layer 60 to reduce the voltage applied across the gate dielectric (52, 54, 56), and reduces power consumption by the field effect transistor.

The mechanism of scavenging is known in the art, and is described, for example, in U.S. Pat. No. 8,367,696 to Ando et al. When a reaction having a more negative change in Gibbs free energy per oxygen atom competes with another reaction having a less negative change in Gibbs free energy per oxygen atom for a limited supply of reactants, the reaction with the more negative change in Gibbs free energy dominates the reaction and consumes a prevailing majority of the available reactants. In the case of oxidation reactions within the gate electrode (60, 62, 64, 66, 68) during a high temperature anneal in an oxidizing ambient, oxygen atoms or oxygen molecules that diffuse through the doped semiconductor material portion 68 and the second metallic compound layer 66 or through the semiconductor material layer 60 and the first metallic compound layer 62 are supplied in a limited quantity. Within the temperature range of the activation anneal, which is typically performed at about 1,000° C., or about 1,300 K, elemental metals such as Al, Be, Mg, Ca, Sr, Ba, Sc, Y, La, Zr, Hf, Dy, Lu, Er, Pr, and Ce have more negative changes in Gibbs free energy relative to typical transition metals such as Ti and Ta. Therefore, elemental metals such as Al, Be, Mg, Ca, Sr, Ba, Sc, Y, La, Zr, Hf, Dy, Lu, Er, Pr, and Ce effectively function as the scavenging material for the scavenging-metal-containing layer 64.

The Gibbs free energy changes for some selected elemental metal atoms by reaction $Si+2/y\ M_xO_y \rightarrow 2x/y\ M+SiO_2$ are given known in the art, for example, in U.S. Pat. No. 8,367,696 to Ando et al. Known values for the Gibbs free energy changes are reproduced in Table 1.

Table 1: The Gibbs free energy change at 1000 K for the reaction $Si+2/y\ M_xO_y \rightarrow 2x/y\ M+SiO_2$, wherein M is the elemental metal.

| Oxide | $Li_2O$ | $Na_2O$ | $K_2O$ | BeO | MgO | CaO | SrO | BaO |
|---|---|---|---|---|---|---|---|---|
| ΔG | +24.298 | −20.061 | −33.749 | +32.405 | +30.572 | +39.914 | +30.821 | +21.338 |
| Oxide | $Sc_2O_3$ | $Y_2O_3$ | $La_2O_3$ | $Ce_2O_3$ | $CeO_2$ | $Pr_2O_3$ | $PrO_2$ | $Nd_2O_3$ |
| ΔG | +123.11 | +116.82 | +98.470 | +104.95 | +36.209 | +105.76 | +13.559 | +101.69 |
| Oxide | $Sm_2O_3$ | EuO | $Eu_2O_3$ | $Gd_2O_3$ | $Tb_2O_3$ | $TbO_{1.72}$ | $Dy_2O_3$ | $Ho_2O_3$ |
| ΔG | +103.94 | +33.238 | +61.901 | +101.55 | +114.76 | +38.273 | +112.44 | +118.45 |
| Oxide | $Er_2O_3$ | $Tm_2O_3$ | $Yb_2O_3$ | $Lu_2O_3$ | $ThO_2$ | $UO_2$ | TiO | $Ti_2O_3$ |
| ΔG | +112.03 | +116.65 | +103.83 | +116.97 | +75.513 | +43.670 | +17.749 | +35.432 |
| Oxide | $TiO_2$ | $ZrO_2$ | $HfO_2$ | VO | $V_2O_3$ | $VO_2$ | NbO | $NbO_2$ |
| ΔG | +7.527 | +42.326 | +47.648 | −5.314 | −30.197 | −43.280 | −10.132 | −13.872 |
| Oxide | $Nb_2O_5$ | $Ta_2O_5$ | $Cr_2O_3$ | $MoO_2$ | $MoO_3$ | $WO_2$ | $WO_{2.72}$ | $WO_3$ |
| ΔG | −86.228 | −52.533 | −55.275 | −76.902 | −143.78 | −77.126 | −107.20 | −121.81 |
| Oxide | MnO | $Mn_3O_4$ | $Mn_2O_3$ | $TcO_2$ | $ReO_2$ | FeO | $Fe_3O_4$ | $Fe_2O_3$ |
| ΔG | −12.752 | −100.60 | −94.689 | −112.91 | −126.66 | −37.774 | −160.08 | −127.47 |
| Oxide | $RuO_2$ | $OsO_2$ | CoO | $Rh_2O_3$ | $IrO_2$ | NiO | PdO | $Cu_2O$ |
| ΔG | −142.27 | −147.25 | −48.041 | −235.15 | −159.47 | −51.377 | −86.066 | −64.284 |
| Oxide | CuO | ZnO | CdO | $Al_2O_3$ | $Ga_2O_3$ | $In_2O_3$ | $GeO_2$ | SnO |
| ΔG | −71.375 | −28.461 | −49.433 | +63.399 | −79.411 | −117.72 | −82.124 | −43.514 |
| Oxide | $SnO_2$ | PbO | $Pb_3O_4$ | $PbO_2$ | $SbO_2$ | $Bi_2O_3$ | $TeO_2$ | |
| ΔG | −84.977 | −59.249 | −269.62 | −155.79 | −110.52 | −191.85 | −140.95 | |

The scavenging-metal-containing layer 64 captures oxygen atoms from above and from below, i.e., the scavenging-metal-containing layer 64 captures oxygen atoms as the oxygen atoms diffuse through the doped semiconductor material portion 68 and the second metallic compound layer 66 in the gate electrode toward the high-k gate dielectric 54, or as the oxygen atoms diffuse from the any material layer in the gate dielectric (52, 54, 56) through the semiconductor material layer 60 and the first metallic compound layer 62. Because the scavenging metal layer is more prone to oxide formation than the first metallic compound layer 62 and the second metallic compound layer 66, the oxygen atoms are consumed within the scavenging-metal-containing layer 64.

The growth of the first interfacial dielectric layer 52 underneath the high-k gate dielectric layer 54 and the growth of the second interfacial dielectric layer 56 above the high-k gate dielectric layer 54 are prevented. Further, the thickness of the first interfacial dielectric layer 52 and the thickness of the second interfacial dielectric layer 56 are reduced as a significant portion of the oxygen atoms in the first interfacial dielectric layer 52 and in the second interfacial dielectric layer 56 is consumed by the scavenging-metal-containing layer 64. Thus, the field effect transistor can maintain a constant threshold voltage even after a high temperature anneal in oxygen ambient. By reducing and limiting the thickness of the first interfacial dielectric layer 52 and the thickness of the second interfacial dielectric layer 56 than what is normally obtainable by conventional processing, the effective oxide thickness (EOT) of a composite gate dielectric stack, which includes the first interfacial dielectric layer 52, the high-k dielectric layer 54, and the second interfacial dielectric layer 56, is reduced, thereby enhancing the scalability of the composite gate dielectric stack and performance of the field effect transistor.

Figure 4:
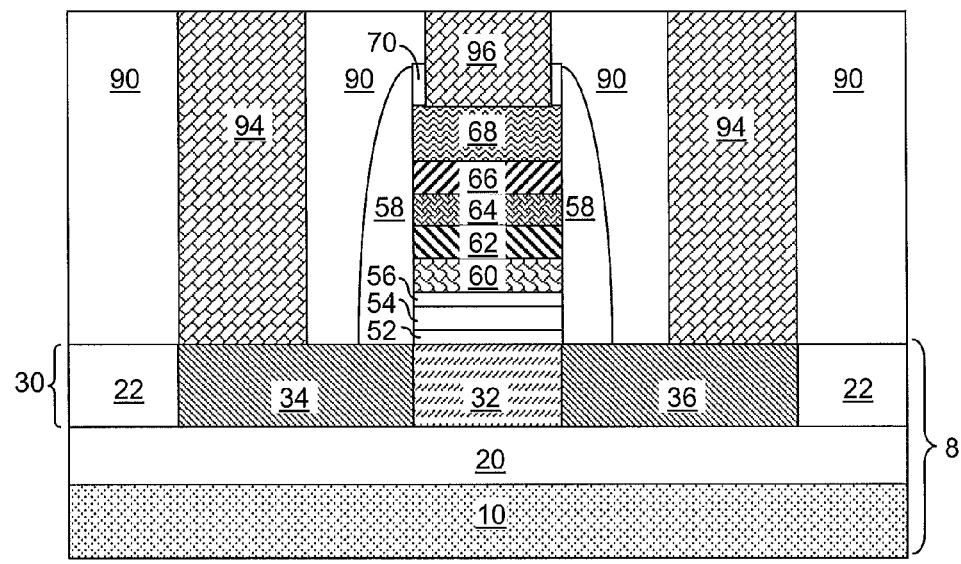
FIG. 4 is a vertical cross-sectional view of the first exemplary semiconductor structure after formation of a contact-level dielectric layer and contact via structures according to the first embodiment of the present disclosure.

Referring to FIG. 4, a contact-level dielectric layer 90 can be deposited over the semiconductor substrate 8 and the gate stack (52, 54, 56, 60, 62, 64, 66, 68, 70). The contact-level dielectric layer 90 includes a dielectric material such as silicon oxide, silicon nitride, silicon oxynitride, organosilicate glass (OSG), or a combination thereof. The contact-level dielectric layer 90 can be subsequently planarized. Various contact via structures can be formed through the contact-level dielectric layer 90 to provide electrical contact to the source region 34, to the drain region 36, and to the gate electrode (60, 62, 64, 66, 68). The various contact via structures can include, for example, active region contact via structures 94 and gate contact via structures 96.

Figure 5:
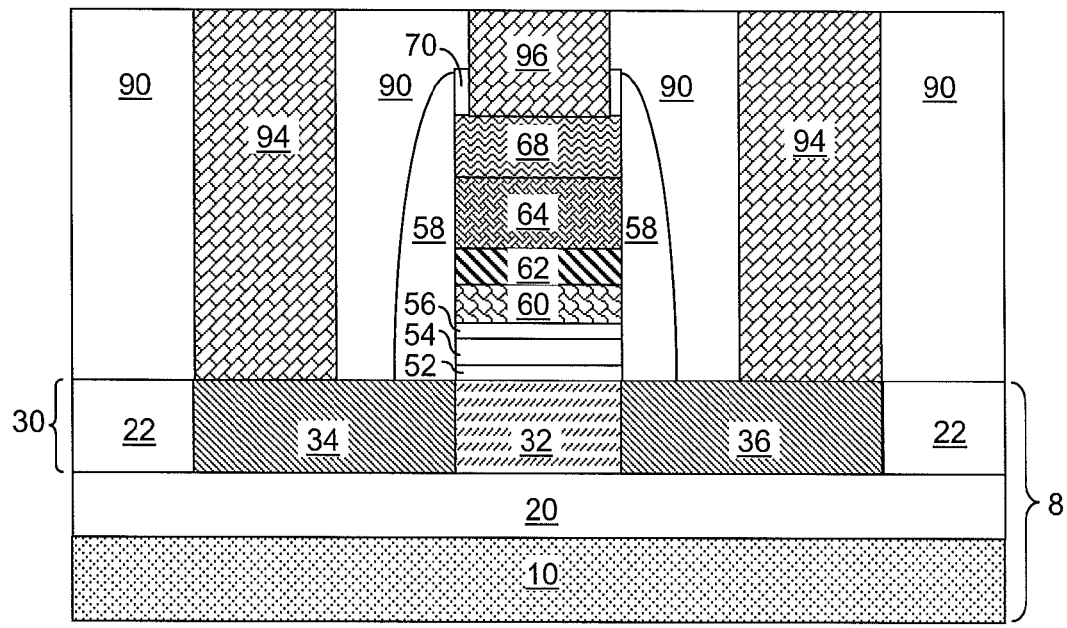
FIG. 5 is a vertical cross-sectional view of a first variation of the first exemplary semiconductor structure after formation of a contact-level dielectric layer and contact via structures according to the first embodiment of the present disclosure.

Referring to FIG. 5, a first variation of the first exemplary semiconductor structure can be derived from the first exemplary structure by omitting formation of the second metallic compound layer 66. In this case, oxygen atoms from the gate dielectric (52, 54, 56) diffuse through the semiconductor material layer 60 and the first metallic compound layer 62 to be react with the at least one scavenging metal in the scavenging-metal-containing layer 64. The thickness and the composition of the first metallic compound layer 62 can be the same as described above. The thickness and the composition of the scavenging-metal-containing layer 64 can be the same as described above.

Figure 6:
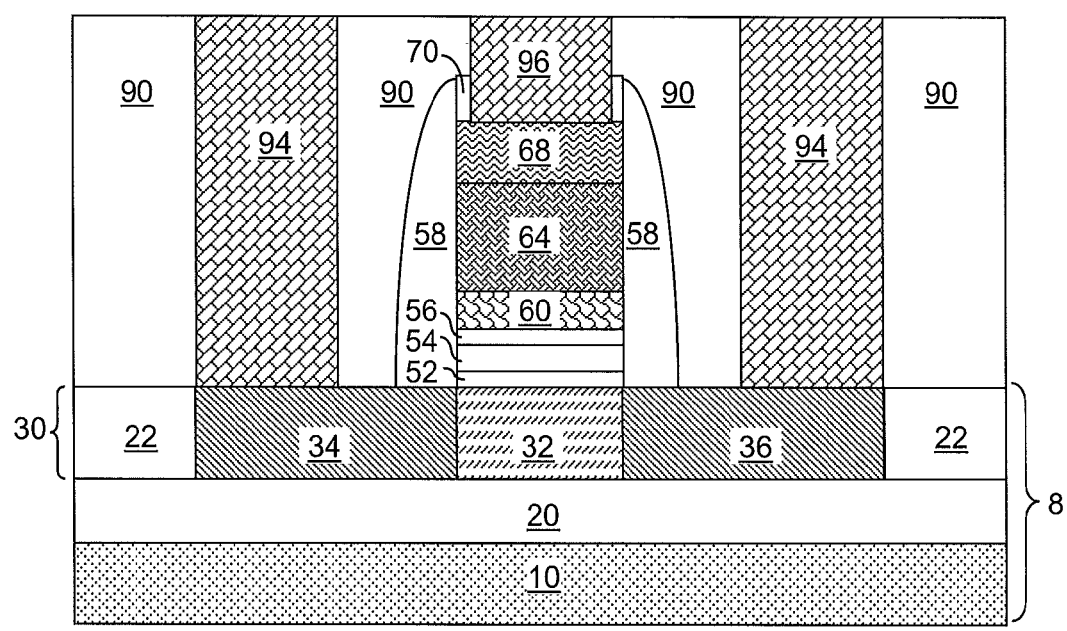
FIG. 6 is a vertical cross-sectional view of a second variation of the first exemplary semiconductor structure after formation of a contact-level dielectric layer and contact via structures according to the first embodiment of the present disclosure.

Referring to FIG. 6, a second variation of the first exemplary semiconductor structure can be derived from the first exemplary structure by omitting formation of the first metallic compound layer 62 and by omitting formation of the second metallic compound layer 66. In this case, oxygen atoms from the gate dielectric (52, 54, 56) diffuse through the semiconductor material layer 60 to be react with the at least one scavenging metal in the scavenging-metal-containing layer 64. The thickness of the scavenging-metal-containing layer 64 can be the same as described above.

The gate electrode (60, 64, 68) contacts the gate dielectric (52, 54, 56) and contains a stack, from bottom to top, of a semiconductor material layer 60 (which is a doped polycrystalline semiconductor material layer) in contact with the gate dielectric (52, 54, 56), and the scavenging-metal-containing layer 64. In this case, the scavenging-metal-containing layer 64 is a scavenging-metal-containing compound layer that contacts the polycrystalline semiconductor material layer and including at least one scavenging metal, at least one elemental metal selected from Ti and Ta, and at least one non-metal element. As used herein, a scavenging-metal-containing compound refers to a compound including at least one scavenging metal and at least one non-metal element. Each of the at least one scavenging metal is a metal (M) for which the Gibbs free energy change of the reaction, $Si+2/y\, M_xO_y \rightarrow 2x/y\, M+SiO_2$, is positive. X and y are positive numbers. X and y may both be 1, or one of x and y may be 1 and the other of x and y may be a positive integer greater than 1, or x and y may be integers greater than 1. Alternately, one or more of x and y may be a positive real number that is not an integer. In one embodiment, x may be a positive integer less than 100, and y may be a real number greater than 0 and less than 100. Gibbs free energy per oxygen atom for formation of an oxide for each of the at least one scavenging metal is equal to or more negative than Gibbs free energy per oxygen atom for formation of an oxide of any elemental metal that is present within the scavenging-material-containing nitride layer and is different from the at least one scavenging metal. Any of the elements described above as a scavenging metal may be employed as the at least one scavenging metal in the scavenging-metal-containing compound layer.

The various gate stack structures of the present disclosure can be implemented as a replacement gate stack structure, which can be formed by employing a replacement gate integration scheme.

Figure 7:
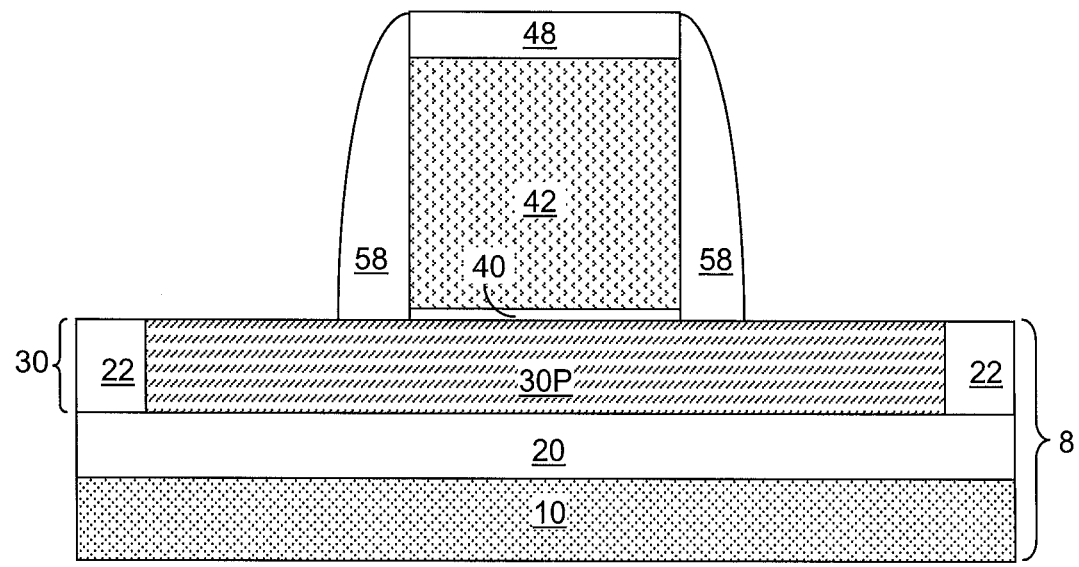
FIG. 7 is a vertical cross-sectional view of a second exemplary semiconductor structure after formation of a disposable gate stack and a gate spacer according to a second embodiment of the present disclosure.

Referring to FIG. 7, a second exemplary semiconductor structure according to a second embodiment of the present disclosure is shown. A disposable gate stack, which contains a stack, from bottom to top, of a disposable gate dielectric 40, a disposable gate material portion 42, and a disposable gate cap dielectric 48 can be formed on a semiconductor substrate 8 instead of the gate stack (52, 54, 56, 60, 62, 64, 66, 68, 70). Source and drain extension regions (not shown) can be optionally formed. A gate spacer 58 can be formed in the same manner as in the first embodiment.

Figure 8:
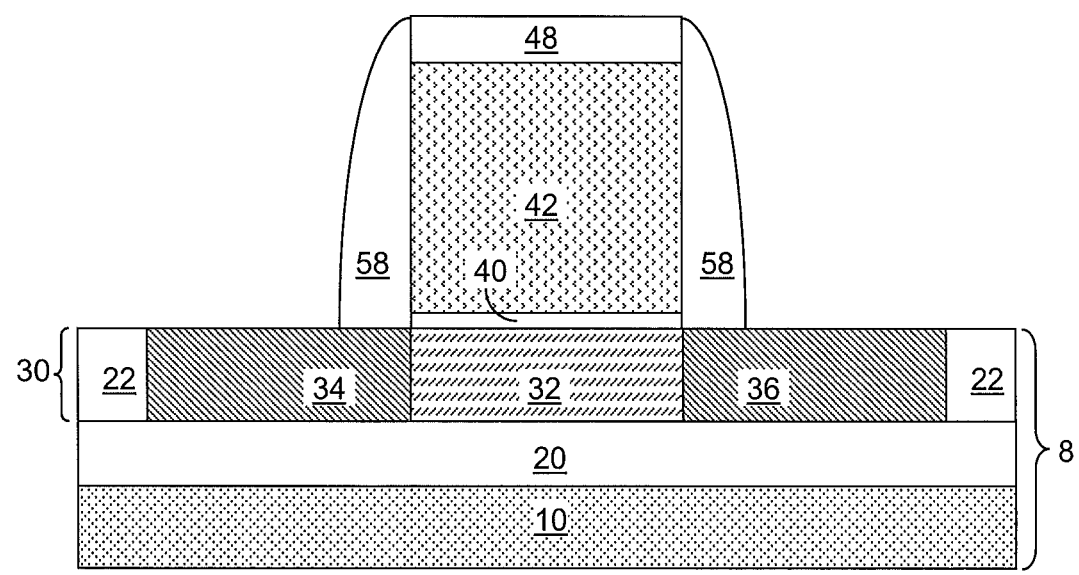
FIG. 8 is a vertical cross-sectional view of the second exemplary semiconductor structure after formation of a source region and a drain region according to the second embodiment of the present disclosure.

Referring to FIG. 8, a source region 34 region, a drain region 36, and a body region 32 can be formed by implantation of dopants into the at least one semiconductor material portion 30P employing the disposable gate stack (40, 42, 48) and the gate spacer 58 as an implantation mask.

Figure 9:
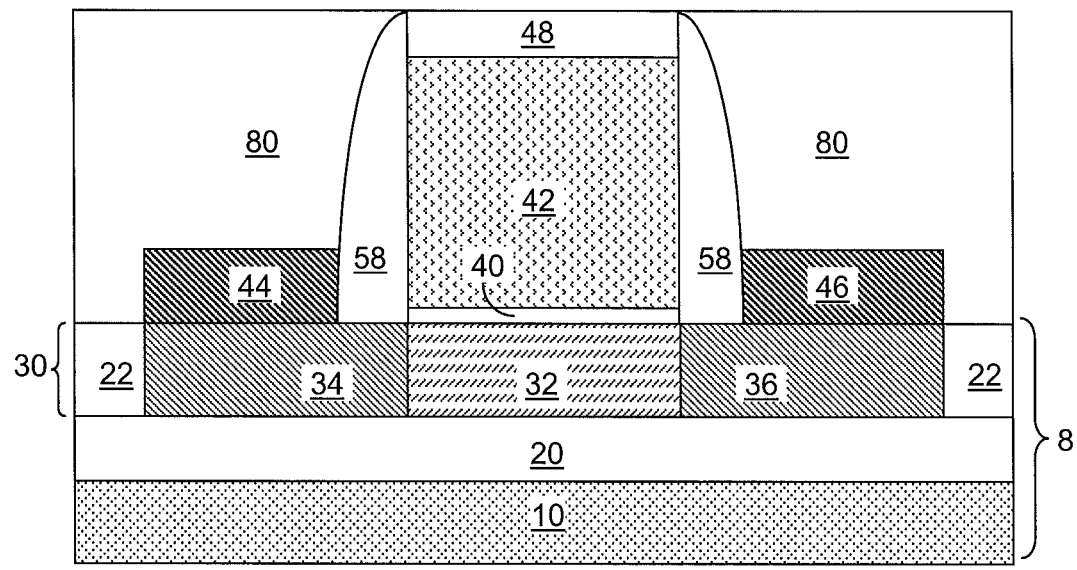
FIG. 9 is a vertical cross-sectional view of the second exemplary semiconductor structure after formation of a planarization dielectric layer according to the second embodiment of the present disclosure.

Referring to FIG. 9, a planarization dielectric layer 80 is deposited over the semiconductor substrate 8, the disposable gate stack (40, 42, 48), and the gate spacer 58. The planarization dielectric layer 80 is planarized, for example, by chemical mechanical planarization (CMP). The disposable gate cap dielectric 48 may be employed as a stopping layer during the planarization.

Figure 10:
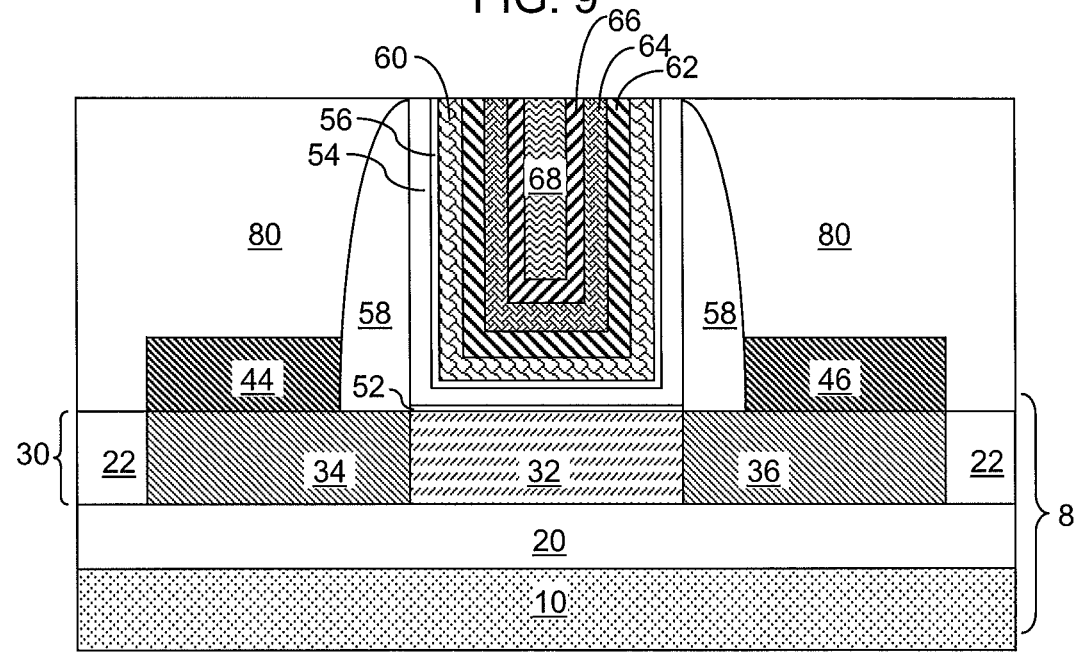
FIG. 10 is a vertical cross-sectional view of the second exemplary semiconductor structure after formation of a gate stack including a first interfacial dielectric layer, a high dielectric constant (high-k) dielectric layer, a second interfacial dielectric layer, a semiconductor material layer, a first metallic compound layer, a scavenging-metal-containing layer, a second metallic compound layer, and an optional doped semiconductor material layer according to the second embodiment of the present disclosure.

Referring to FIG. 10, the disposable gate stack (40, 42, 48) is removed selective to the dielectric material of the planarization dielectric layer 80 to form a gate cavity. The same gate stack layers (52L, 54L, 56L, 60L, 62L, 64L, 66L, 68L, 70L) as in the first embodiment (as illustrated in FIG. 1) less the gate cap dielectric layer 70L can be formed within the gate cavity and over the planarization dielectric layer 80. The excess portions of the gate stack layers (52L, 54L, 56L, 60L, 62L, 64L, 66L, 68L; See FIG. 1) of the second embodiment are removed from above the top surface of the planarization dielectric layer 80, for example, by chemical mechanical planarization (CMP). The gate stack, which is a replacement gate stack, of the second embodiment includes a first interfacial dielectric layer 52, a high dielectric constant (high-k) dielectric layer 54, a second interfacial dielectric layer 56, a semiconductor material layer 60 (which may be an amorphous semiconductor material layer or a polycrystalline semiconductor material layer prior to an activation anneal), a first metallic compound layer 62, a scavenging-metal-containing layer 64, a second metallic compound layer 66, and an optional doped semiconductor material portion 68. The optional doped semiconductor material layer 68

Figure 11:
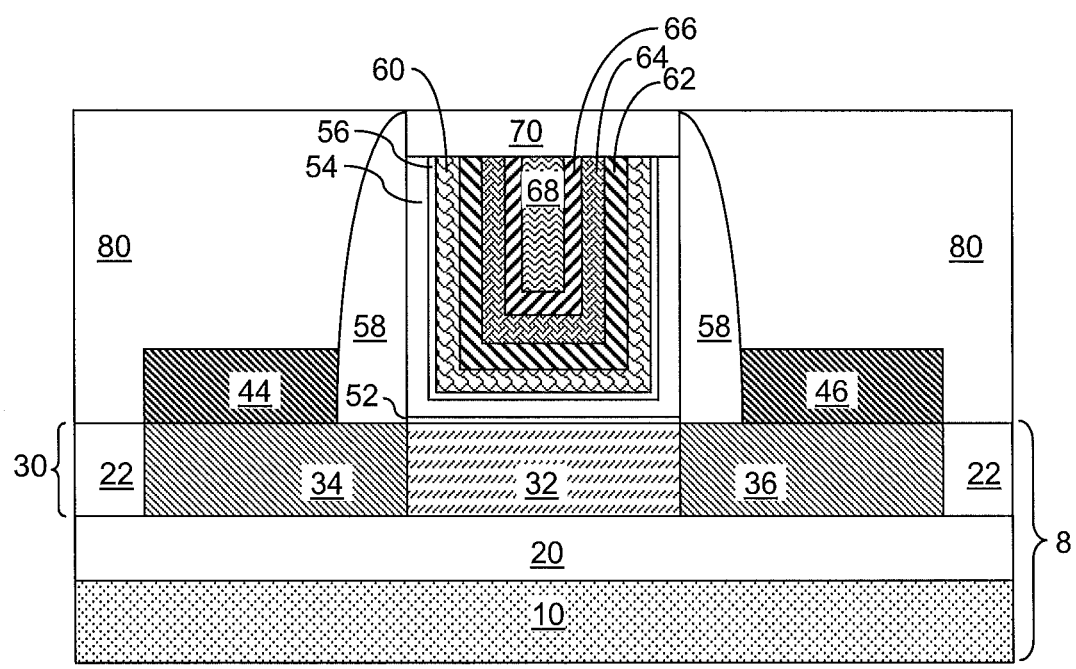
FIG. 11 is a vertical cross-sectional view of the second exemplary semiconductor structure after formation a gate cap dielectric and an anneal according to the second embodiment of the present disclosure.

Referring to FIG. 11, the top surface of the gate stack (52, 54, 56, 60, 62, 64, 66, 68) can be recessed relative to the top surface of the planarization dielectric layer 80. A gate cap dielectric portion 70 is formed within the recessed region over the gate stack (52, 54, 56, 60, 62, 64, 66, 68), for example, by deposition of a dielectric material layer and removal of portions of the dielectric material layer from above the top surface of the planarization dielectric layer 80, for example, by chemical mechanical planarization (CMP). In one embodiment, the gate cap dielectric portion 70 can include an oxygen-impermeable material such as silicon nitride. The thickness of the gate cap dielectric portion 70 can be, for example, from 4 nm to 40 nm, although lesser and greater thicknesses can also be employed.

An activation anneal can be performed in the same manner as in the first embodiment. The same oxygen scavenging phenomenon occurs within the gate stack (52, 54, 56, 60, 62, 64, 66, 68) as in the first embodiment through the same mechanism.

Figure 12:
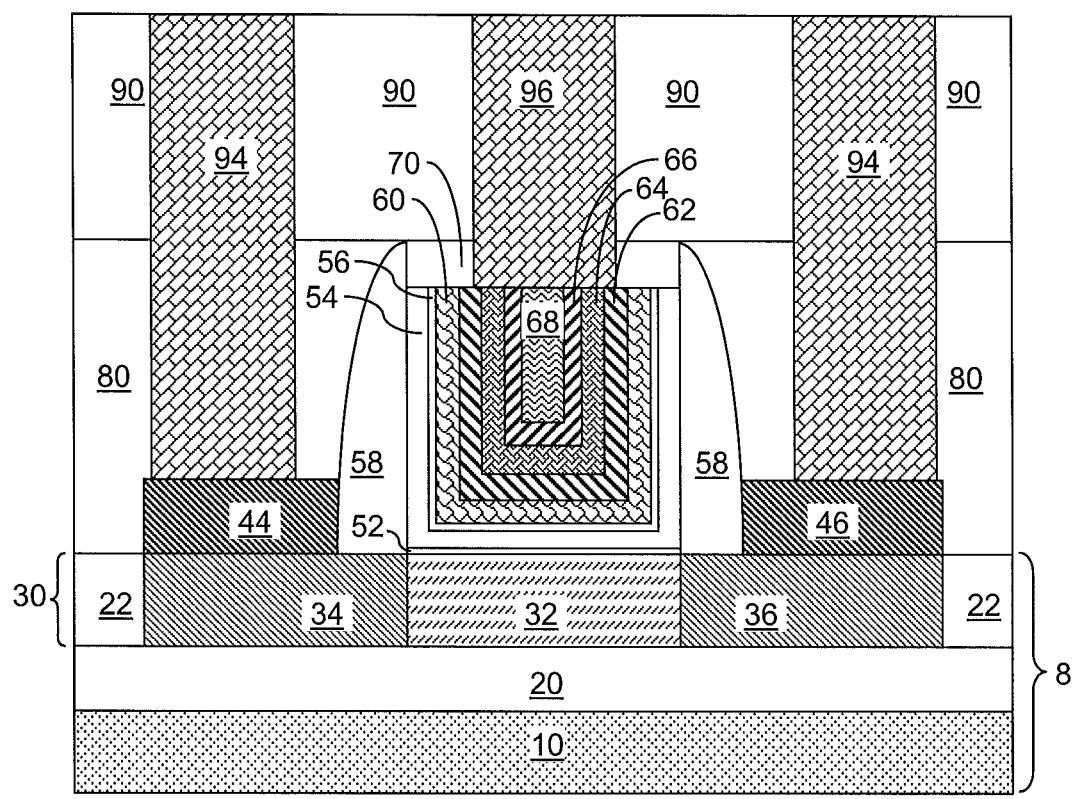
FIG. 12 is a vertical cross-sectional view of the second exemplary semiconductor structure after formation of a contact-level dielectric layer and contact via structures according to the second embodiment of the present disclosure.

Referring to FIG. 12, a contact-level dielectric layer 90 can be deposited over the planarization dielectric layer 80. The contact-level dielectric layer 90 can have the same composition as in the first embodiment. Various contact via structures can be formed through the contact-level dielectric layer 90 and optionally through the planarization dielectric layer 80 to provide electrical contact to the source region 34, to the drain region 36, and to the gate electrode (60, 62, 64, 66, 68). The various contact via structures can include, for example, active region contact via structures 94 and gate contact via structures 96.

Figure 13:
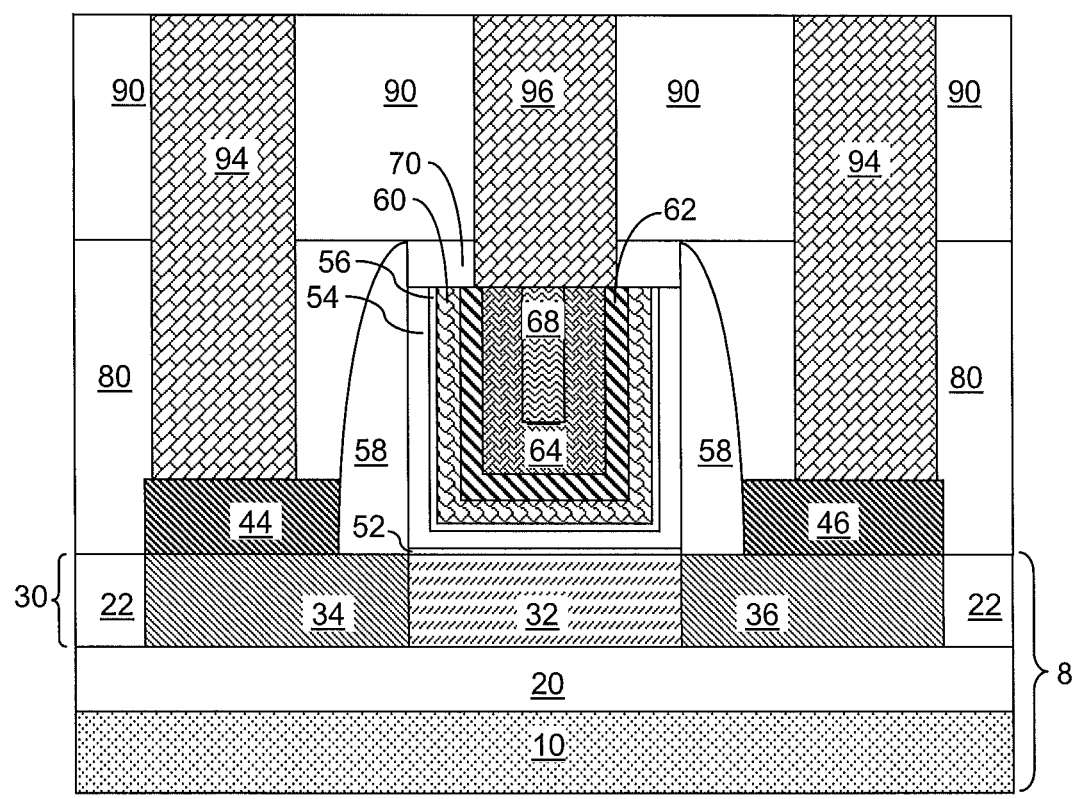
FIG. 13 is a vertical cross-sectional view of a first variation of the second exemplary semiconductor structure after formation of a contact-level dielectric layer and contact via structures according to the second embodiment of the present disclosure.

Referring to FIG. 13, a first variation of the second exemplary semiconductor structure can be derived from the second exemplary structure by omitting formation of the second metallic compound layer 66. In this case, oxygen atoms from the gate dielectric (52, 54, 56) diffuse through the semiconductor material layer 60 and the first metallic compound layer 62 to be react with the at least one scavenging metal in the scavenging-metal-containing layer 64. The thickness and the composition of the first metallic compound layer 62 can be the same as in the first exemplary semiconductor structure. The thickness and the composition of the scavenging-metal-containing layer 64 can be the same as in the first exemplary semiconductor structure.

Figure 14:
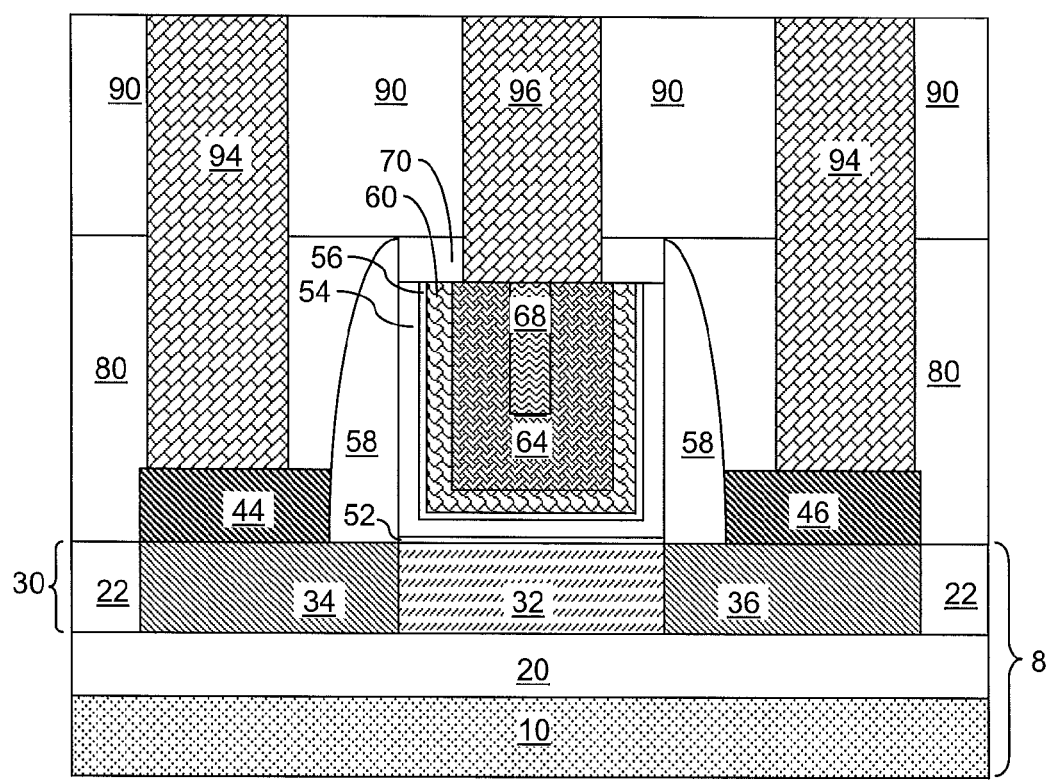
FIG. 14 is a vertical cross-sectional view of a second variation of the second exemplary semiconductor structure after formation of a contact-level dielectric layer and contact via structures according to the second embodiment of the present disclosure.

Referring to FIG. 14, a second variation of the first exemplary semiconductor structure can be derived from the second exemplary structure by omitting formation of the first metallic compound layer 62 and by omitting formation of the second metallic compound layer 66. In this case, oxygen atoms from the gate dielectric (52, 54, 56) diffuse through the semiconductor material layer 60 to be react with the at least one scavenging metal in the scavenging-metal-containing layer 64. The thickness of the scavenging-metal-containing layer 64 can be the same as in the first exemplary semiconductor structure.

The gate electrode (60, 64, 68) contacts the gate dielectric (52, 54, 56) and contains a stack, from bottom to top, of a semiconductor material layer 60 (which is a doped polycrystalline semiconductor material layer) in contact with the gate dielectric (52, 54, 56), and the scavenging-metal-containing layer 64. In this case, the scavenging-metal-containing layer 64 is a scavenging-metal-containing compound layer that contacts the polycrystalline semiconductor material layer and including at least one scavenging metal, at least one elemental metal selected from Ti and Ta, and at least one non-metal element. Each of the at least one scavenging metal is a metal (M) for which the Gibbs free energy change of the reaction, $Si+2/y\ M_xO_y \rightarrow 2x/y\ M+SiO_2$, is positive. X and y are positive numbers. X and y may both be 1, or one of x and y may be 1 and the other of x and y may be a positive integer greater than 1, or x and y may be integers greater than 1. Alternately, one or more of x and y may be a positive real number that is not an integer. In one embodiment, x may be a positive integer less than 100, and y may be a real number greater than 0 and less than 100. Gibbs free energy per oxygen atom for formation of an oxide for each of the at least one scavenging metal is equal to or more negative than Gibbs free energy per oxygen atom for formation of an oxide of any elemental metal that is present within the scavenging-material-containing nitride layer and is different from the at least one scavenging metal. Any of the elements described above as a scavenging metal may be employed as the at least one scavenging metal in the scavenging-metal-containing compound layer.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A semiconductor structure comprising:
   a semiconductor substrate comprising a semiconductor material;
   a gate dielectric comprising a high dielectric constant (high-k) dielectric layer having a dielectric constant greater than 7.5 and located over said semiconductor substrate; and
   a gate electrode contacting said gate dielectric and containing a stack, from bottom to top, of a polycrystalline semiconductor material layer in contact with said gate dielectric, a metallic compound layer including a metallic compound, and a scavenging-metal-containing layer including at least one scavenging metal, wherein said at least one scavenging metal in said scavenging-metal containing layer is in an elemental form or in a metallic non-metal-element-containing compound including said at least one scavenging metal, at least one elemental metal selected from the group consisting of Ti and Ta, and at least one non-metal element.

2. The semiconductor structure of claim 1, wherein each of said at least one scavenging metal is a metal (M) for which the Gibbs free energy change of the reaction, $Si+2/y\ M_xO_y \rightarrow 2x/y\ M+SiO_2$, is positive, wherein x and y are positive numbers, and wherein Gibbs free energy per oxygen atom for formation of an oxide for each of said at least one scavenging metal is equal to or more negative than Gibbs free energy per oxygen atom for formation of an oxide of any elemental metal that is present within said metallic compound in said metallic compound layer.

3. The semiconductor structure of claim 2, said gate electrode further comprises another metallic compound layer contacting a top surface of said scavenging-metal-containing layer and including another metallic compound selected from one of a metallic nitride and a metallic carbide, wherein said Gibbs free energy per oxygen atom for formation of said oxide for each of said at least one scavenging metal is equal to or more negative than Gibbs free energy per oxygen atom for formation of an oxide of any elemental metal that is present within said another metallic compound in said another metallic compound layer.

4. The semiconductor structure of claim 1, wherein said at least one scavenging metal is present in an elemental form within said scavenging-metal-containing layer.

5. The semiconductor structure of claim 1, wherein said metallic compound is selected from one of a metallic nitride and a metallic carbide.

6. The semiconductor structure of claim 1, wherein said at least one scavenging metal is present in a metallic non-metal-element-containing compound that consists essentially of said at least one scavenging metal, at least one elemental metal selected from the group consisting of Ti and Ta, and at least one non-metal element.

7. The semiconductor structure of claim 1, wherein said at least one scavenging metal is aluminum that is present within TiAlN, TaAlN, or an alloy thereof.

8. The semiconductor structure of claim 1, wherein said at least one scavenging metal is at least one element selected from the group consisting of Al, Be, Mg, Ca, Sr, Ba, Sc, Y, La, Ti, Zr, Hf, Dy, Lu, Er, Pr, and Ce.

9. The semiconductor structure of claim 1, wherein said gate electrode further comprises a doped semiconductor material portion overlying said scavenging-metal-containing layer or embedded within said scavenging-metal-containing layer.

10. The semiconductor structure of claim 1, wherein said gate dielectric further comprises an interfacial dielectric layer that contacts said polycrystalline semiconductor material layer and comprises an oxide of a semiconductor material of said polycrystalline semiconductor material layer.

11. A semiconductor structure comprising:
- a semiconductor substrate comprising a semiconductor material;
- a gate dielectric comprising a high dielectric constant (high-k) dielectric layer having a dielectric constant greater than 7.5 and located over said semiconductor substrate; and
- a gate electrode contacting said gate dielectric and containing a stack, from bottom to top, of a polycrystalline semiconductor material layer in contact with said gate dielectric, and a scavenging-metal-containing compound layer contacting said polycrystalline semiconductor material layer and including at least one scavenging metal, at least one elemental metal selected from the group consisting of Ti and Ta, and at least one non-metal element.

12. The semiconductor structure of claim 11, wherein each of said at least one scavenging metal is a metal (M) for which the Gibbs free energy change of the reaction, $Si + 2/y\, M_xO_y \rightarrow 2x/y\, M + SiO_2$, is positive, wherein x and y are positive numbers, and wherein Gibbs free energy per oxygen atom for formation of an oxide for each of said at least one scavenging metal is equal to or more negative than Gibbs free energy per oxygen atom for formation of an oxide of any elemental metal that is present within said scavenging-material-containing nitride layer and is different from said at least one scavenging metal.

13. The semiconductor structure of claim 12, said gate electrode further comprises a metallic compound layer contacting a top surface of said scavenging-metal-containing compound layer and including a metallic compound selected from one of a metallic nitride and a metallic carbide, wherein said Gibbs free energy per oxygen atom for formation of said oxide for each of said at least one scavenging metal is equal to or more negative than Gibbs free energy per oxygen atom for formation of an oxide of any elemental metal within said metallic compound in said metallic compound layer.

14. The semiconductor structure of claim 11, wherein said at least one scavenging metal is present in a metallic non-metal-element-containing compound that consists essentially of said at least one scavenging metal, at least one elemental metal selected from the group consisting of Ti and Ta, and at least one non-metal element.

15. The semiconductor structure of claim 11, wherein said at least one scavenging metal is at least one element selected from the group consisting of Al, Be, Mg, Ca, Sr, Ba, Sc, Y, La, Ti, Zr, Hf, Dy, Lu, Er, Pr, and Ce.

16. The semiconductor structure of claim 11, wherein said gate electrode further comprises a doped semiconductor material portion overlying said scavenging-metal-containing compound layer or embedded within said scavenging-metal-containing compound layer.

* * * * *